United States Patent
Kamgaing et al.

(10) Patent No.: US 10,128,177 B2
(45) Date of Patent: Nov. 13, 2018

(54) MULTI-LAYER PACKAGE WITH INTEGRATED ANTENNA

(71) Applicant: Intel Corporation, Santa Clara, CA (US)

(72) Inventors: Telesphor Kamgaing, Chandler, AZ (US); Adel A. Elsherbini, Chandler, AZ (US); Torrey W. Frank, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/433,369

(22) PCT Filed: May 6, 2014

(86) PCT No.: PCT/US2014/036949
§ 371 (c)(1),
(2) Date: Apr. 2, 2015

(87) PCT Pub. No.: WO2015/171118
PCT Pub. Date: Nov. 12, 2015

(65) Prior Publication Data
US 2016/0020165 A1    Jan. 21, 2016

(51) Int. Cl.
*H01L 21/00* (2006.01)
*H01L 23/498* (2006.01)
(Continued)

(52) U.S. Cl.
CPC ...... *H01L 23/49838* (2013.01); *G06F 1/1613* (2013.01); *H01L 21/288* (2013.01);
(Continued)

(58) Field of Classification Search
None
See application file for complete search history.

(56) References Cited

U.S. PATENT DOCUMENTS

| 3,616,403 A | 10/1971 | Collins et al. |
| 5,892,661 A | 4/1999 | Stanfford et al. |
| (Continued) | | |

FOREIGN PATENT DOCUMENTS

| JP | H0888319 A | 4/1996 |
| JP | 10-138672 A | 5/1998 |
| (Continued) | | |

OTHER PUBLICATIONS

International Search Report and Written Opinion dated Jan. 26, 2015, issued in corresponding International Application No. PCT/US2014/036949, filed May 6, 2014, 12 pages.
(Continued)

*Primary Examiner* — Reema Patel
(74) *Attorney, Agent, or Firm* — Schwabe, Williamson & Wyatt, P.C.

(57) ABSTRACT

Embodiments of the present disclosure describe a multi-layer package with antenna and associated techniques and configurations. In one embodiment, an integrated circuit (IC) package assembly includes a first layer having a first side and a second side disposed opposite to the first side a second layer coupled with the first side of the first layer, one or more antenna elements coupled with the second layer and a third layer coupled with the second side of the first layer, wherein the first layer is a reinforcement layer having a tensile modulus that is greater than a tensile modulus of the second layer and the third layer. Other embodiments may be described and/or claimed.

15 Claims, 5 Drawing Sheets

(51) Int. Cl.
*G06F 1/16* (2006.01)
*H01L 21/288* (2006.01)
*H01L 23/522* (2006.01)
*H01L 23/66* (2006.01)
*H01L 23/14* (2006.01)
*H01L 21/48* (2006.01)
*H01L 23/00* (2006.01)

(52) U.S. Cl.
CPC .......... *H01L 21/486* (2013.01); *H01L 23/145* (2013.01); *H01L 23/49822* (2013.01); *H01L 23/49827* (2013.01); *H01L 23/49894* (2013.01); *H01L 23/5223* (2013.01); *H01L 23/66* (2013.01); *H01L 21/4857* (2013.01); *H01L 23/49816* (2013.01); *H01L 23/562* (2013.01); *H01L 2223/6672* (2013.01); *H01L 2223/6677* (2013.01); *H01L 2224/16227* (2013.01); *H01L 2224/32225* (2013.01); *H01L 2224/48227* (2013.01); *H01L 2224/73204* (2013.01); *H01L 2924/10253* (2013.01); *H01L 2924/1421* (2013.01); *H01L 2924/1433* (2013.01); *H01L 2924/1434* (2013.01); *H01L 2924/15311* (2013.01); *H01L 2924/15321* (2013.01); *H01L 2924/3511* (2013.01)

(56) References Cited

U.S. PATENT DOCUMENTS

| | | |
|---|---|---|
| 6,556,311 B1 | 4/2003 | Benear et al. |
| 2004/0061105 A1 | 4/2004 | St. Lawrence et al. |
| 2008/0085572 A1 | 4/2008 | Yang et al. |
| 2009/0315797 A1* | 12/2009 | Rofougaran ......... H01Q 1/2283 343/787 |
| 2011/0147055 A1 | 6/2011 | Ma et al. |
| 2011/0147059 A1 | 6/2011 | Ma et al. |
| 2011/0163457 A1* | 7/2011 | Mohan ................ H01L 21/4853 257/774 |
| 2012/0012378 A1 | 1/2012 | Jeon et al. |
| 2013/0027073 A1 | 1/2013 | Pagani et al. |
| 2013/0111020 A1 | 5/2013 | Cohen et al. |
| 2013/0193572 A1 | 8/2013 | Liou et al. |
| 2013/0313009 A1* | 11/2013 | Seol .................... H05K 3/0094 174/262 |
| 2014/0104798 A1 | 4/2014 | Park et al. |

FOREIGN PATENT DOCUMENTS

| | | |
|---|---|---|
| JP | 2002-312747 A | 10/2002 |
| TW | 200931456 A | 7/2009 |
| TW | 201314859 A | 4/2013 |
| TW | 201413928 A | 4/2014 |
| WO | WO2010035627 A1 | 4/2010 |
| WO | WO2011075265 A2 | 6/2011 |

OTHER PUBLICATIONS

Search Report dated Mar. 9, 2016 for Taiwan Application No. 104110731, 2 pages.
Office Action dated Oct. 19, 2017 for Korean Application No. 2016-7027611, 17 pages.
Office Action dated Nov. 1, 2017 for Russian Application No. 2016139295, 12 pages.
Office Action dated Nov. 14, 2017 for Japanese Application No. 2017-506248, 14 pages.
Extended European Search Report dated Dec. 21, 2017 for European Application No. 14891343.7, 9 pages.
Office Action dated Jul. 3, 2018 for Japanese Application No. 2017-506248, 21 pages.

\* cited by examiner

MULTI-LAYER PACKAGE WITH INTEGRATED ANTENNA

CROSS REFERENCE TO RELATED APPLICATION

The present application is a national phase entry under 35 U.S.C. § 371 of International Application No. PCT/US2014/036949, filed May 6, 2014, entitled "MULTI-LAYER PACKAGE WITH INTEGRATED ANTENNA," which designates, among the various States, the United States of America. The entire content and disclosure of International Application No. PCT/US2014/036949 is hereby incorporated by reference in its entirety for all purposes.

FIELD

Embodiments of the present disclosure generally relate to the field of materials for integrated circuit (IC) assemblies, and more particularly, to a multi-layer package with antenna.

BACKGROUND

Integration of high performance wireless radios (e.g., millimeter wave radios) on low loss package substrates raises a variety of challenges. For example, a thick dielectric layer may be used between a radiating element such as an antenna and an underlying ground plane in order for the integrated antenna to cover a broad frequency band (e.g., 7 GHz around 60 GHz), which may result in ultra-thick package substrates. A variety of low loss substrate materials may provide better electrical performance at frequencies of integrated wireless radios, however such low loss substrate materials may be more flexible and may not have sufficient mechanical stability to be processed as ultra-thick layers for antenna integration. For example, flexible materials may be more susceptible to package warpage. Accordingly, current solutions may utilize more rigid materials such as, for example, low temperature co-fired ceramic (LTCC), which may also be a more costly material. In some cases, materials that increase mechanical rigidity of a substrate material may increase surface roughness, which may lead to increased conductor losses at higher frequencies. Structurally rigid configurations that are thinner and/or cheaper with lower loss and surface roughness may be desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
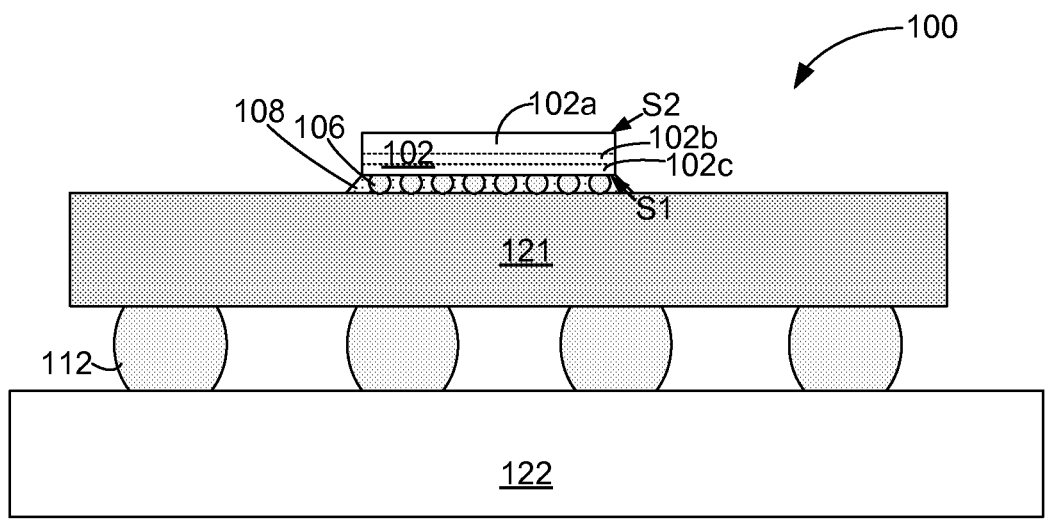
FIG. 1 schematically illustrates a cross-section side view of an example integrated circuit (IC) assembly, in accordance with some embodiments.

Embodiments of the present disclosure describe a multi-layer package with antenna and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) assembly 100, in accordance with some embodiments. In some embodiments, the IC assembly 100 may include one or more dies (hereinafter "die 102") electrically and/or physically coupled with a package assembly 121 (sometimes referred to as a "package substrate"). In some embodiments, the package assembly 121 may be electrically coupled with a circuit board 122, as can be seen.

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a radio frequency (RF) die. In other embodiments, the die may be, include, or be a part of a processor, memory, SoC, or ASIC.

In some embodiments, an underfill material 108 (sometimes referred to as an "encapsulant") may be disposed between the die 102 and the package assembly 121 to promote adhesion and/or protect features of the die 102 and package assembly 121. The underfill material 108 may be composed of an electrically insulative material and may encapsulate at least a portion of the die 102 and/or die-level interconnect structures 106, as can be seen. In some embodiments, the underfill material 108 is in direct contact with the die-level interconnect structures 106.

The die 102 can be attached to the package assembly 121 according to a wide variety of suitable configurations including, for example, being directly coupled with the package assembly 121 in a flip-chip configuration, as depicted. In the flip-chip configuration, an active side, S1, of the die 102 including active circuitry is attached to a surface of the package assembly 121 using die-level interconnect structures 106 such as bumps, pillars, or other suitable structures that may also electrically couple the die 102 with the package assembly 121. The active side S1 of the die 102 may include transistor devices, and an inactive side, S2, may be disposed opposite to the active side S1, as can be seen.

The die 102 may generally include a semiconductor substrate 102a, one or more device layers (hereinafter "device layer 102b"), and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate 102a. The device layer 102b may include, for example, structures such as channel bodies and/or source/drain regions of transistor devices. The interconnect layer 102c may include interconnect structures that are configured to route electrical signals to or from the active devices in the device layer 102b. For example, the interconnect layer 102c may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

In some embodiments, the package assembly 121 may include a multi-layer package assembly with integrated components for wireless communication as described herein. The wireless communication may include, for example, short range wireless data transfer between portable devices and/or wireless displays or high speed wireless communication between peer devices. For example, in some embodiments, the package assembly 121 may be a multi-layer package assembly as described in connection with FIGS. 2-9.

The package assembly 121 may include electrical routing features (not shown in FIG. 1) such as, for example, traces, pads, through-holes, vias, or lines configured to route electrical signals to or from the die 102. For example, the package assembly 121 may be configured to route electrical signals between the die 102 and components for wireless communication that are integrated within the package assembly, or between the die 102 and the circuit board 122, or between the die 102 and another electrical component (e.g., another die, interposer, interface, component for wireless communication, etc.) coupled with the package assembly 121.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin prepreg material. Interconnect structures (not shown) such as traces, trenches or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 902 of FIG. 9).

Package-level interconnects such as, for example, solder balls 112 may be coupled with the package assembly 121 and/or the circuit board 122 to form corresponding solder joints that are configured to further route the electrical signals between the package assembly 121 and the circuit board 122. Other suitable techniques to physically and/or electrically couple the package assembly 121 with the circuit board 122 may be used in other embodiments.

The IC assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC package assembly 100 may be used in some embodiments.

Figure 2:
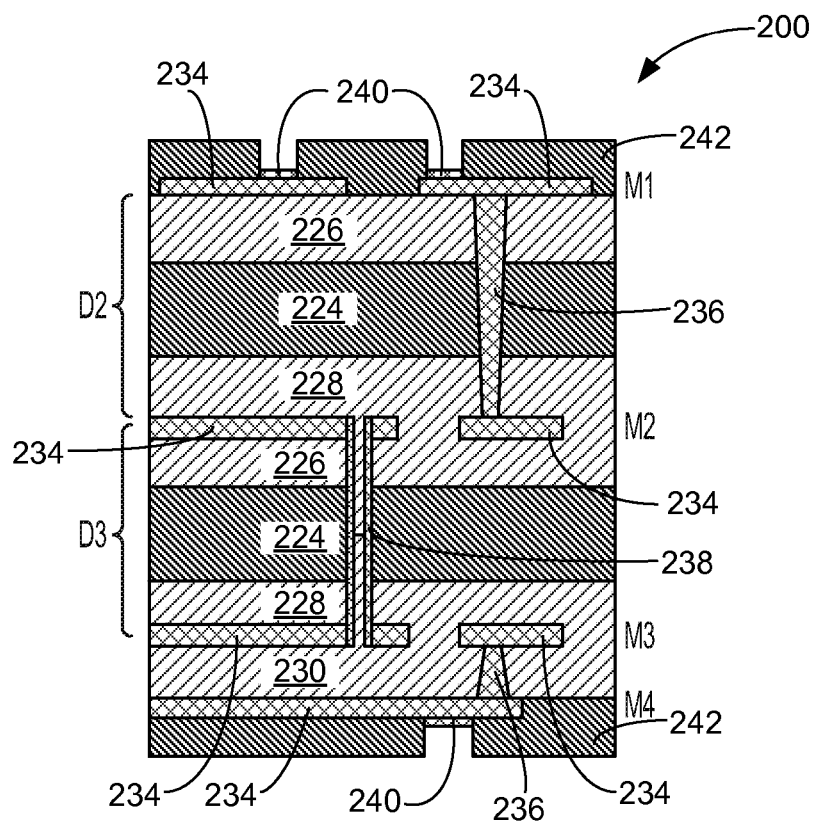
FIG. 2 schematically illustrates a cross-section side view of a multi-layer package assembly, in accordance with some embodiments.

FIG. 2 schematically illustrates a cross-section side view of a multi-layer package assembly 200, in accordance with some embodiments. According to various embodiments, the multi-layer package assembly 200 may include one or more reinforced portions such as, for example, reinforced portions D2, D3. The multi-layer package assembly 200 may include more or fewer reinforced portions than depicted in other embodiments.

Each of the reinforced portions D2, D3 may include a first layer 224 having a first side coupled with a second layer 226 and a second side coupled with a third layer 228, as can be seen. The first layer 224 may serve as a reinforcement layer to increase a stiffness of the multi-layer package assembly 200. The first layer 224 may be more structurally rigid (e.g., have a higher tensile modulus) than the second layer 226 and third layer 228. The inclusion of a reinforcement layer (e.g., first layer 224) may reduce warpage (e.g., incoming and dynamic warpage) of the multi-layer package assembly 200.

For example, in some embodiments, the first layer 224 may be composed of a core-like material having low loss dielectric properties such as, for example, a prepreg material or liquid crystal polymer (LCP) derivative such as, for example, LCP with glass (e.g., filler, cloth, fibers, etc.), polyether ether ketone (PEEK), or build-up layer material such as, for example, an epoxy-based material of an Ajinomoto Build-up Film (ABF), which may be reinforced with other strengthening materials in some embodiments. The first layer 224 may be composed of other suitable low loss reinforcing materials in other embodiments. In some embodiments, the first layer 224 may have a dielectric constant, k, that is less than 4 and a loss tangent dissipation factor that is less than about 0.005 to provide a low loss material for RF applications. The first layer 224 may have other ranges of values for dielectric constant k and loss tangent dissipation factor in other embodiments.

In some embodiments, the first layer 224 may have a coefficient of thermal expansion (CTE) that is less than a CTE of the second layer 226 and third layer 228. The inclusion of the reinforcement layer (e.g., first layer 224) may reduce the CTE of the stack in the Z-direction relative to a package assembly without a reinforcement layer and facilitate assembly of the multi-layer package assembly 200 using low loss materials such as LCP, which may be typically thermally unstable.

In some embodiments, the second layer 226 and the third layer 228 may be composed of a low loss dielectric material such as, for example, LCP or ABF (e.g., ABF GY13) with less reinforcing material than the first layer 224 or no reinforcing material (e.g., LCP without glass). The second layer 226 and the third layer 228 may have a tensile modulus that is less than a tensile modulus of the first layer 224. In some embodiments, the second layer 226 and the third layer 228 may have a same material composition in some embodiments. The second layer 226 and the third layer 228 may be composed of other suitable low loss dielectric materials in other embodiments.

In some embodiments, the second layer 226 and third layer 228 have a surface roughness that is less than a surface roughness of the first layer 224. For example, the second layer 226 and third layer 228 may be laminated on both sides of the reinforcing material of the first layer 224 to reduce surface roughness of the reinforced portions D2, D3. A lower surface roughness may reduce conductor losses of the multi-layer package assembly 200. Direct metal plating on the rougher reinforcing material of the first layer 224 may lead to higher conductor losses and may be detrimental to performance of antenna and/or signal traces, while direct metal plating on a smoother surface of the second layer 226 and/or third layer 228 may result in lower conductor losses.

The second layer 226 and third layer 228 may each have a thickness that is less than or equal to a thickness of the first layer 224. For example, in one embodiment, the first layer 224 of the reinforced portion D2 may have a thickness of about 50 microns, the second layer 226 of the reinforced portion D2 may have a thickness of about 50 microns, and the third layer 228 of the reinforced portion D2 may have a thickness of about 50 microns. In the embodiment, the first layer 224 of the reinforced portion D3 may have a thickness of about 50 microns, the second layer 226 of the reinforced portion D3 may have a thickness of about 25 microns and the third layer 228 of the reinforced portion D3 may have a thickness of about 25 microns. In some embodiments, the second layer 226 and third layer 228 may have a dielectric constant, k, that is less than 4 and a loss tangent dissipation factor that is less than about 0.005. The second layer 226 and the third layer 228 may have other thicknesses and/or may have other ranges of values for dielectric constant k and loss tangent dissipation in other embodiments.

In some embodiments, one or more additional layers 230 may be coupled with the third layer 228 of one of reinforced portions D2, D3. The one or more additional layers 230 may have a same material composition as the second layer 226 and/or the third layer 228 in some embodiments. In one embodiment, the one or more additional layers 230 may have a thickness of about 50 microns. The one or more additional layers 230 may have other suitable thicknesses and/or may be composed of other suitable materials in other embodiments.

According to various embodiments, the multi-layer package assembly 200 may include one or more electrically conductive features configured to facilitate wireless communication and/or to route electrical signals. In some embodiments, the one or more electrically conductive features may include metal layers such as, for example, first metal layer (M1), second metal layer (M2), third metal layer (M3) and fourth metal layer (M4). The metal layers M1, M2, M3 and M4 may be selectively deposited or patterned to provide circuitry of the multi-layer package assembly 200. Each of the metal layers M1, M2, M3 and M4 may be formed by any suitable process including, for example, depositing copper (Cu) using a plating process. Other metals and/or deposition techniques may be used in other embodiments. Additionally, the multi-layer package assembly 200 may include more or fewer metal layers than depicted in other embodiments.

In some embodiments, the metal layers are formed only on the second layer 226 and third layer 228 and are not formed on the first layer 224 of the reinforced portions D2, D3. The second layer 226 and third layer 228 may be smoother than the first layer 224 and formation of the metal layers M1, M2, M3 and M4 on the smoother layers may reduce conductor losses in the multi-layer package assembly 200. In some embodiments, the first layer 224 defines a plane extending in a horizontal direction and no plated metal features (e.g., of lines 234) for routing electrical signals in the horizontal direction are directly disposed on the first layer 224, as can be seen.

In some embodiments, one or more electrical routing features may be formed in the multi-layer package assembly 200 to route electrical signals between conductive elements. For example, the electrical routing features may include lines 234, one or more vias 236 and/or plated through-holes (PTHs) 238 to route electrical signals in a vertical direction. The vias 236 and/or the PTHs 238 may extend through the first layer 224, the second layer 226 and the third layer 228, as can be seen. The lines 234 may be configured in non-linear shapes or geometries in some embodiments. In some embodiments, each of the lines 234 may have a thickness of about 15 microns. The lines 234 may have other suitable thicknesses in other embodiments. The electrical routing features may include other suitable features in other embodiments including, for example, laser-drilled through holes (LTHs) and the like.

According to various embodiments, the reinforced portions, D2, D3 may be part of a multi-layer package assembly 200 that integrates components of a wireless communication device such as, for example, one or more antenna elements. The antenna elements may include, for example, plated metal features of lines 234 in the metal layer M1 that are formed on the second layer 226 of the reinforced portion D2 and/or lines 234 in the metal layer M2 that are formed on the third layer 228 of the reinforced portion D2.

In some embodiments, the multi-layer package assembly 200 may include components of a multi-layer or single-layer antenna. The multi-layer antenna may have broader frequency bandwidth relative to a single-layer antenna. A multi-layer antenna may include a capacitively coupled antenna in some embodiments.

For example, the lines 234 in the metal layer M1 may include a first capacitive element and the lines 234 in the metal layer M2 may include a second capacitive element formed on the third layer 228. The first capacitive element and second capacitive element may each be a patch of a stacked patch, where each of the patches is configured to resonate at offset frequencies, which may provide an antenna with wider frequency bandwidth. In some embodiments, the plated metal features of lines 234 in metal layers M1 and/or M2 may be wideband antenna elements for millimeter (mm) wave standalone and/or phased array antenna modules.

In some embodiments, the lines 234 of the metal layer M2 may be configured to provide an antenna layer and/or routing for low frequency (LF) signals such as, for example, power delivery, control signals, clock, reset and the like. The lines 234 of the metal layer M3 may be configured to provide a radio frequency (RF) ground plane and/or routing for LF signals. In some embodiments, the lines 234 of the metal layer M4 may be configured to route RF and/or LF signals. The lines 234 may be configured to route other electrical signals in other embodiments. The multi-layer package assembly 200 may include other components for wireless communication in other embodiments.

In some embodiments, a distance is provided between an antenna layer (e.g., including antenna elements) of metal layer M1 and/or M2 and an RF ground plane of the multi-layer package assembly 200. For example, the distance may be configured to provide at least a distance of $\lambda/4$ between a nearest antenna layer and the RF ground plane, where $\lambda$ is a wavelength of a frequency band used for wireless communication by the antenna elements. In some embodiments, $\lambda/4$ is about 5/4 mm. The minimum distance between the antenna layer and the RF ground plane and $\lambda$ may have other values in other embodiments. For example, in order to realize low profile systems, the separation between the ground plane and the nearest antenna layer may be in the order of $\lambda/25$ or even less.

According to various embodiments, the multi-layer package assembly 200 may include one or more solder mask layers formed on an outermost surface of the multi-layer package assembly 200. The one or more solder mask layers 242 may have openings to allow formation of electrical connections (e.g., solder bumps, pillars, or balls) between pads 240 coupled with the electrically conductive features of the multi-layer package assembly 200 such as, for example, lines of the metal layer M1 and/or the metal layer M4, as can be seen. The pads 240 may be configured to receive, for example, a die (e.g., die 102 of FIG. 1) or other electrical assembly. In some embodiments, the one or more solder mask layers 242 may be composed of a low loss dielectric material such as, for example, LCP or like material to reduce losses at a frequency of wireless communication of the multi-layer package assembly. In one embodiment, the one or more solder mask layers 242 may each have a thickness of about 25 microns. The one or more solder mask layers 242 may have other suitable thicknesses and/or may be composed of other suitable materials in other embodiments such as, for example, solder resist materials.

Figure 3:
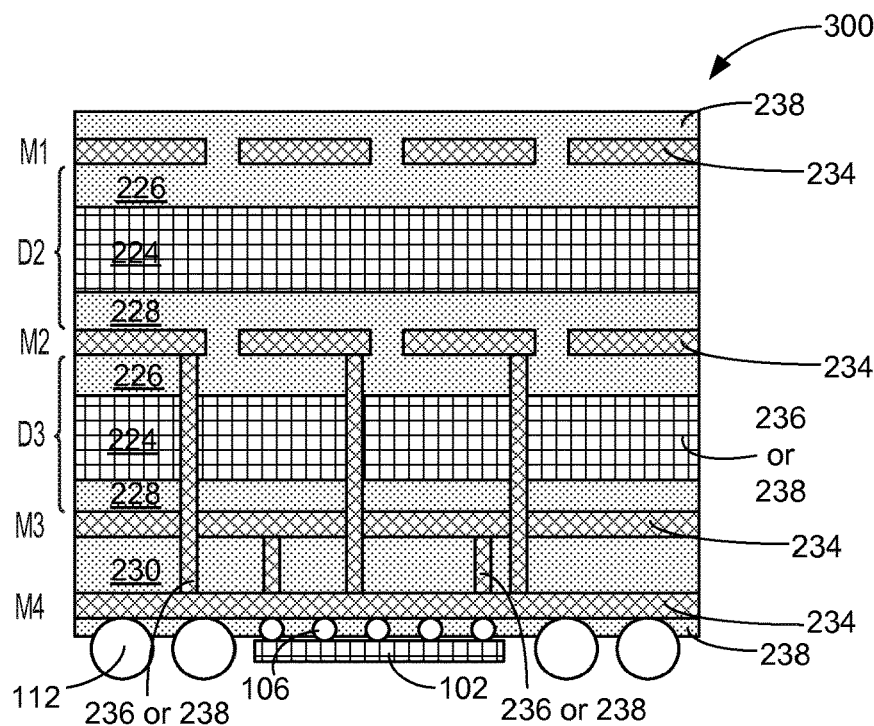
FIG. 3 schematically illustrates a cross-section side view of a multi-layer package assembly coupled with a die, in accordance with some embodiments.

FIG. 3 schematically illustrates a cross-section side view of a multi-layer package assembly 300 coupled with a die 102, in accordance with some embodiments. According to various embodiments, the multi-layer package assembly 300 may comport with embodiments described in connection with multi-layer package assembly 200 and vice versa.

In some embodiments, the multi-layer package assembly 300 may represent a multi-layer antenna phased array module. For example, lines 234 of metal layer M1 and metal layer M2 may be antenna elements of a multi-layer antenna. Lines 234 of metal layer M3 may be an antenna ground plane (e.g., RF ground plane) and lines 234 of metal layer M4 may provide RF routing.

According to some embodiments, a die 102 may be coupled with the multi-layer package assembly 300, as can be seen. The die 102 may represent, for example, an RF die configured for wireless communication at a frequency of about 60 GHz, in some embodiments. The die 102 may be coupled with the lines 234 of the metal layer M4 using one or more die-level interconnect structures 106. In some embodiments, the die-level interconnect structures 106 may be coupled with pads (e.g., pads 240 of FIG. 2) that are electrically coupled with the lines 234 of the metal layer M4.

In some embodiments, one or more package-level interconnects such as, for example, solder balls 112 may be coupled with the multi-layer package assembly 300 to facilitate coupling of the multi-layer package assembly 300 with other electrical assemblies (e.g., circuit board 122 of FIG. 1). Other suitable package-level interconnects may be used to couple the multi-layer package assembly 300 with other electrical assemblies.

Figure 4:
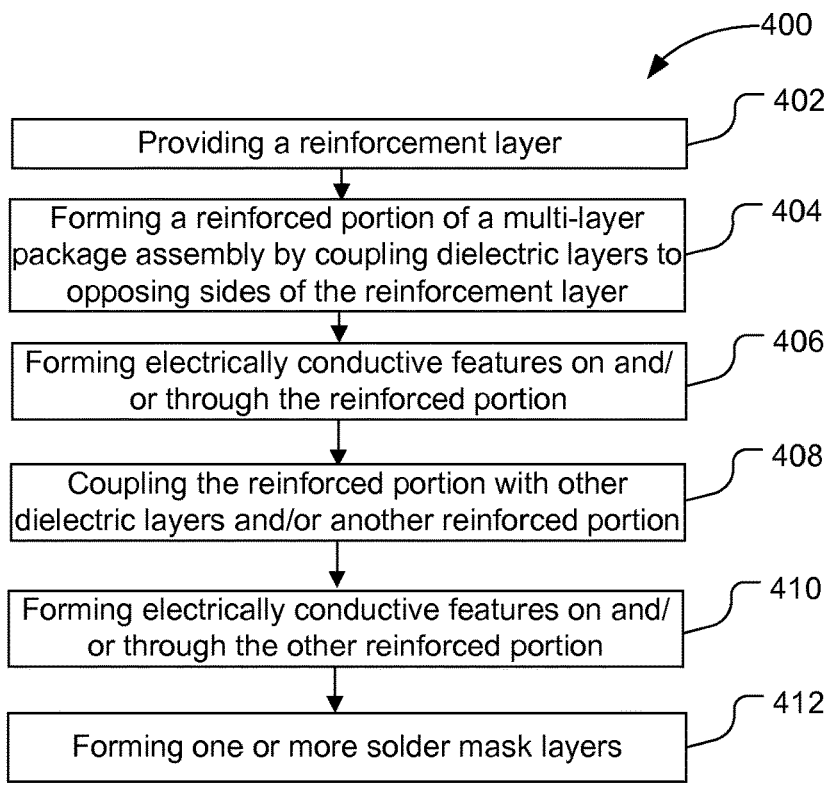
FIG. 4 schematically illustrates a flow diagram for a method of fabricating a multi-layer package assembly, in accordance with some embodiments.

FIG. 4 schematically illustrates a flow diagram for a method 400 of fabricating a multi-layer package assembly (e.g., multi-layer package assembly 200 or 300 of FIG. 2 or 3), in accordance with some embodiments. The method 400 may comport with techniques described in connection with FIGS. 2-3 and vice versa.

At 402, the method 400 may include providing one or more reinforcement layers. The one or more reinforcement layers may generally comport with embodiments described in connection with first layer 224 of reinforced portions D2, D3 of FIGS. 2-3.

At 404, the method 400 may include forming a reinforced portion (e.g., reinforced portion D2 or D3 of FIG. 2 or 3) of the multi-layer package assembly by coupling dielectric layers (e.g., second layer 226 and third layer 228) to opposing sides of the reinforcement layer. In some embodiments, the dielectric layers may be coupled with the reinforcement layer using a lamination process, which may be performed simultaneously in some embodiments. According to various embodiments, multiple reinforced portions (e.g., reinforced portions D2 and D3 of FIGS. 2-3) may be formed by performing actions described in connection with 402 and 404. The reinforcement layer may have a tensile modulus that is greater than a tensile modulus of the dielectric layers.

At 406, the method 400 may include forming electrically conductive features on and/or through the reinforced portion. For example, in some embodiments, one or more openings may be formed (e.g., drilled) through a first reinforced portion (e.g., D3 of FIG. 2 or 3) for one or more corresponding PTHs. The one or more openings may extend through the dielectric layers and reinforcement layer of the reinforced portion. Metal may be deposited by a plating process to plate the one or more PTHs to form metal layers (e.g., metal layer M2 and metal layer M3) on opposing surfaces of the reinforced portion. The metal layers may be formed directly on the dielectric layers of the first reinforced portion in some embodiments. In some embodiments, one or more of the metal layers may include one or more antenna elements. Thus, actions at 406 may include forming one or more antenna elements in some embodiments.

At 408, the method 400 may include coupling the reinforced portion with other dielectric layers (e.g., one or more additional layers 230 of FIG. 2 or 3) and/or another reinforced portion (e.g., reinforced portion D2 of FIG. 2 or 3). For example, in some embodiments, the first reinforced portion (e.g., D3 of FIG. 2 or 3) may be coupled with a second reinforced portion (e.g., reinforced portion D2 of FIG. 2 or 3) and one or more dielectric layers (e.g., one or more additional layers 230) using a lamination process, which may be performed simultaneously in some embodiments.

At 410, in a case where the reinforced portion is coupled with another reinforced portion at 408, the method 400 may include forming electrically conductive features on and/or through the other reinforced portion. For example, in some embodiments, one or more openings may be formed (e.g., drilled) through the other reinforced portion (e.g., second reinforced portion) for one or more corresponding vias. The one or more openings may extend through the dielectric layers and reinforcement layer of the second reinforced portion. Metal may be deposited by a plating process to plate the vias and to form metal layers (e.g., metal layer M1 and metal layer M4) on opposing surfaces of a structure that includes the first reinforced portion and the second reinforced portion coupled together. For example, a metal layer may be formed directly on an outermost dielectric layer of the first reinforced portion and another metal layer may be formed on an outermost dielectric layer of the second reinforced portion. In some embodiments, one or more of the metal layers may include one or more antenna elements. Thus, actions at 410 may include forming one or more antenna elements in some embodiments. In some embodiments, metal may be deposited to fill the one or more openings during a same metal deposition process that is used to form the one or more antenna elements.

At 412, the method 400 may include forming one or more solder mask layers (e.g., solder mask layers 242 of FIG. 2 or 3). The solder mask layers may be formed on outermost layers of the structure formed at 410. In one embodiment, the solder mask layer may be formed on a dielectric layer (e.g., second layer 226 of FIG. 2) of the reinforced structure. In some embodiments, the solder mask layers include precut structures that are coupled with the reinforced portion(s) using a lamination process. Pads (e.g., pads 240 of FIG. 2) may be formed on an outermost metal layer (e.g., metal layer M1 of FIG. 2) and openings may be formed to expose the pads to provide corresponding connection points for coupling of the multi-layer package assembly with other electrical devices. Forming the pads may include a surface finishing process including, for example, a gold (Au) surface finishing process or other suitable metal finishing process in some embodiments. For example, one or more dies may be coupled with the multi-layer package assembly using the pads in some embodiments.

Embodiments of the present disclosure may describe techniques to increase stiffness of thick dielectric layers in a multi-layer package assembly using a core-like material having dielectric properties that are compatible with wireless signaling. The thick dielectric layers (e.g., reinforced portion) may have lower surface roughness resulting in lower conductor losses. One or more of the reinforced dielectric layers may be integrated with antenna elements for wireless communication. In some embodiments, the present disclosure describes techniques to provide an all LCP multi-layer package assembly with improved electrical properties at mm-wave frequencies. The reinforced portion may reduce a CTE of the multi-layer package assembly in the Z-direction and may facilitate assembly using materials such as LCP, which may be thermally unstable. The reinforced portion may reduce incoming and/or dynamic warpage of the multi-layer package assembly. In some embodiments, the multi-layer package assembly may have an asymmetric layer build-up and/or multiple reinforced portions, which may reduce a number of layers compared to a traditional core substrate (e.g., may be laminated in-situ to meet antenna specifications).

Figure 5:
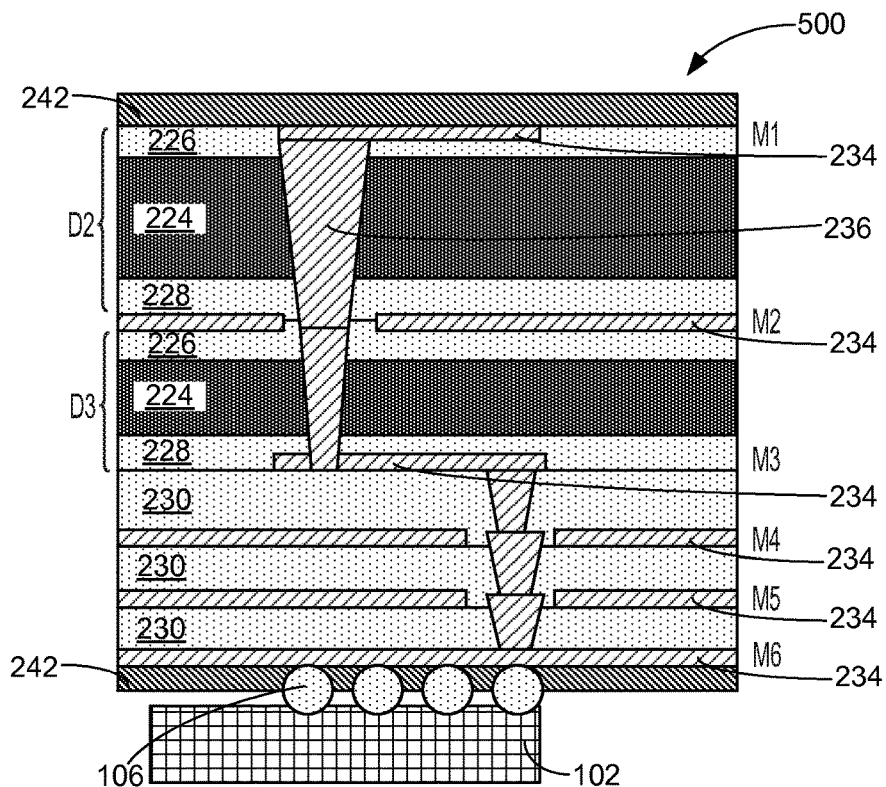
FIG. 5 schematically illustrates a cross-section side view of another multi-layer package assembly, in accordance with some embodiments.

FIG. 5 schematically illustrates a cross-section side view of another multi-layer package assembly 500, in accordance with some embodiments. According to various embodiments, components of the multi-layer package assembly 500 may comport with embodiments described in connection with components of the multi-layer package assemblies 200 and 300 of FIGS. 2 and 3. The multi-layer package assembly 500 further includes lines 234 of metal layers M4, M5 and M6, as can be seen.

In some embodiments, the multi-layer package assembly 500 may include reinforced portions D2, D3 coupled together, as can be seen. In an embodiment, each of the reinforced portions D2, D3 may represent a coated prepreg core (e.g., coated prepreg core 700 of FIG. 7) including a prepreg core coated with smoother dielectric layers (e.g., second layer 226 and third layer 228).

Lines 234 of metal layer M1 may represent one or more antenna elements formed on the second layer 226 of the reinforced portion D2. In one embodiment, the lines 234 may represent features of a single-layer antenna. The first layer 224 may be composed of a core material such as, for example, a prepreg material. Lines 234 of metal layer M3 may represent an antenna ground plane formed on the third layer 228 of the reinforced portion D3. The reinforced portions D2, D3 may provide a separation between radiating features such as the one or more antenna elements and the antenna ground plane.

Lines 234 of metal layer M2 may represent an RF routing layer. In some embodiments, the RF routing layer may be formed on the third layer 228 of the reinforced portion D3, as can be seen. Such configuration may provide an asymmetric stack that allows reduction of a number of dielectric layers formed to provide a desired thickness of the multi-layer package assembly 500 relative to a symmetric stack.

The lines 234 of metal layers M1, M2, M3 may be composed of a same or different material. The multi-layer package assembly 500 may include more or fewer reinforced portions and/or additional layers 230 than depicted in other embodiments.

Figure 6:
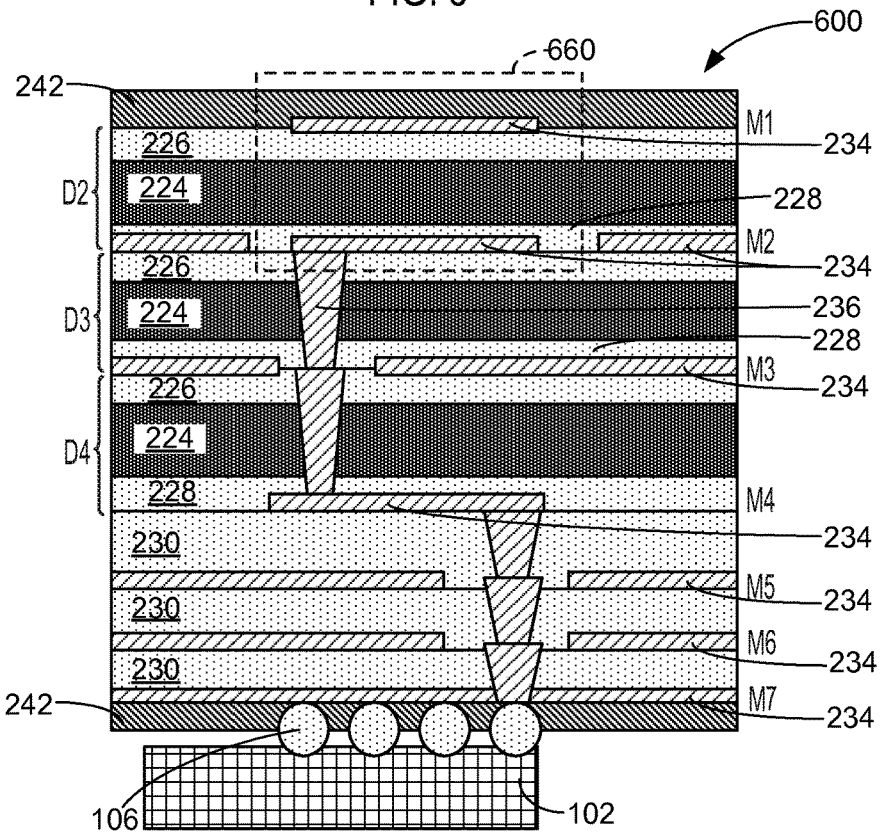
FIG. 6 schematically illustrates a cross-section side view of another multi-layer package assembly, in accordance with some embodiments.

FIG. 6 schematically illustrates a cross-section side view of another multi-layer package assembly 600, in accordance with some embodiments. The multi-layer package assembly 600 may comport with embodiments described in connection with multi-layer package assembly 500 and vice versa. The multi-layer package assembly 600 may further include another reinforced portion D4 and lines 234 of metal layer M7.

In some embodiments, the multi-layer package assembly 600 may include multiple reinforced portions D2, D3, D4 coupled together, as can be seen. The lines 234 of the metal layers M1 and M2 may represent capacitively coupled antenna elements 660 of a multi-layer antenna in some embodiments. The antenna elements of the metal layers M1 and M2 may be formed on opposing sides of the reinforced portion D2, as can be seen.

The lines 234 of metal layer M3 may represent an antenna ground plane and the lines 234 of metal layer M4 may represent an RF routing layer. Such configuration may provide an asymmetric stack that allows reduction of a number of dielectric layers formed to provide a desired thickness of the multi-layer package assembly 600 relative to a symmetric stack.

The lines 234 of metal layers M1, M2, M3, M4 may be composed of a same or different material. The multi-layer package assembly 600 may include more or fewer reinforced portions and/or additional layers 230 than depicted in other embodiments.

Figure 7:
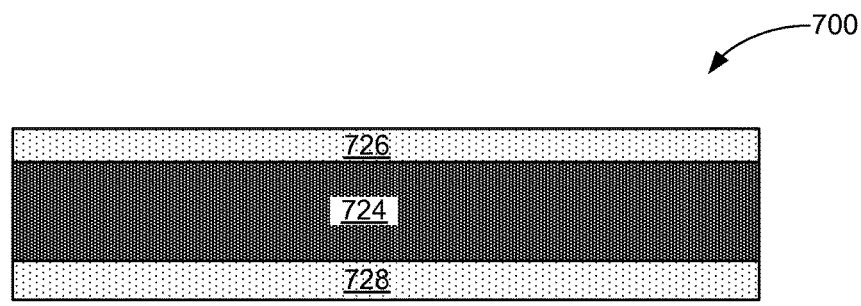
FIG. 7 schematically illustrates a cross-section side view of a coated prepreg core, in accordance with some embodiments.

FIG. 7 schematically illustrates a cross-section side view of a coated prepreg core 700, in accordance with some embodiments. In some embodiments, the coated prepreg core 700 may represent one of the reinforced portions (e.g., D2, D3, D4) of a multi-layer package assembly described herein.

The coated prepreg core 700 may include a prepreg core 724 and soft dielectric layers 726, 728 coupled with opposing sides of the prepreg core 724, as can be seen. The prepreg core 724 may comport with embodiments described in connection with first layer 224 of FIG. 2, dielectric layer 726 may comport with embodiments described in connection with second layer 226 of FIG. 2 and dielectric layer 728 may comport with embodiments described in connection with third layer 228 of FIG. 2. In some embodiments, the coated prepreg core 700 may be formed prior to coupling the coated prepreg core 700 with other reinforced portions or layers of a multi-layer package assembly.

Figure 8:
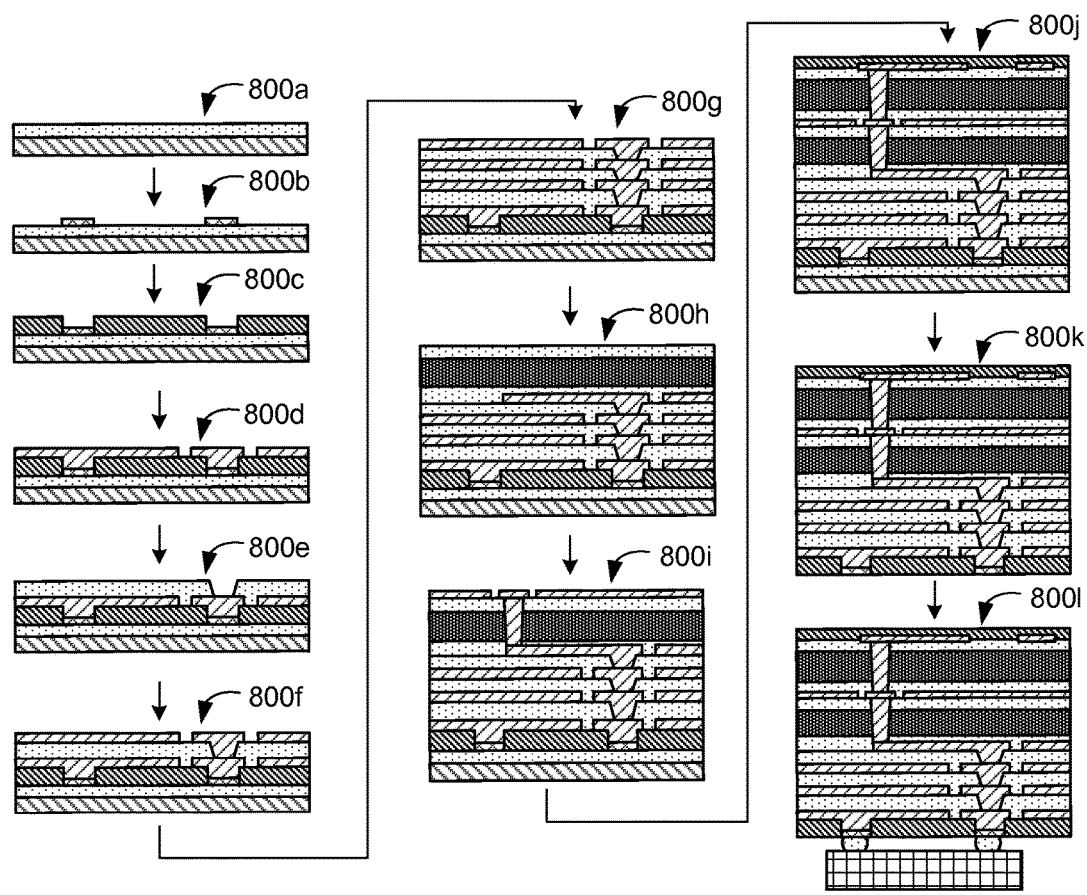
FIG. 8 schematically illustrates a cross-section side view of a multi-layer package assembly during various stages of fabrication, in accordance with some embodiments.

FIG. 8 schematically illustrates a cross-section side view of a multi-layer package assembly during various stages of fabrication, in accordance with some embodiments. The structures of the multi-layer package assembly in FIG. 8 may have similar markings as those labeled in FIG. 5 and are intended to represent similar structures, except where otherwise indicated. Numeric labels for each of the structures of the multi-layer package assembly of FIG. 8 are not shown for the sake of clarity.

The multi-layer package assembly 800*a* is depicted subsequent to providing a temporary film on a carrier, as can be seen. The temporary film may be a dielectric layer having a similar composition as one or more additional layers 230 of FIG. 5, in some embodiments.

The multi-layer package assembly 800*b* may represent the multi-layer package assembly 800*a* subsequent to forming one or more pads (e.g., pads 240 of FIG. 2) on the temporary film. The one or more pads may be formed by depositing one or more metals using any suitable technique. In some embodiments, forming the one or more pads may include a surface finish process where gold, nickel, palladium and/or an organic solderability preservative (OSP) may be deposited to form at least a portion of the pad.

The multi-layer package assembly 800*c* may represent the multi-layer package assembly 800*b* subsequent to forming a solder resist layer (e.g., one or more solder mask layers 242 of FIG. 5) on the temporary film and forming openings to expose the pads, as can be seen. The solder resist layer and openings may be formed using any suitable technique.

The multi-layer package assembly 800*d* may represent the multi-layer package assembly 800*c* subsequent to forming a metal layer (e.g., metal layer M6 of FIG. 5) on the solder resist layer and vias to fill the openings between the metal layer and the pads, as can be seen. In some embodiments, the metal layer may be a final conductive layer of the multi-layer package assembly 800*d*. The metal layer and vias may be formed according to any suitable technique including, for example, a plating process.

The multi-layer package assembly 800*e* may represent the multi-layer package assembly 800*d* subsequent to forming a dielectric layer (e.g., one or more additional layers 230 of FIG. 5) on the metal layer and forming one or more openings for one or more corresponding vias in the dielectric layer. In some embodiments, the dielectric layer may be a final build-up layer of the multi-layer package assembly 800*e* that is coupled with the metal layers using a lamination process.

The multi-layer package assembly 800*f* may represent the multi-layer package assembly 800*e* subsequent to forming another metal layer (e.g., metal layer M5 of FIG. 5) on the dielectric layer. The multi-layer package assembly 800*g* may represent the multi-layer package assembly 800*f* subsequent to forming additional dielectric layers and metal layers.

The multi-layer package assembly 800*h* may represent the multi-layer package assembly 800*g* subsequent to coupling a reinforced portion (e.g., reinforced portion D3 of FIG. 5) with the already formed dielectric layers and metal layers. In some embodiments, the reinforced portion may be a coated prepreg core (e.g., coated prepreg core 700 of FIG. 7) that is coupled with the dielectric layers and metal layers using a lamination process.

The multi-layer package assembly 800*i* may represent the multi-layer package assembly 800*h* subsequent to forming a metal layer (e.g., metal layer M2 of FIG. 5) on the reinforced portion and a via through the reinforced portion.

The multi-layer package assembly 800*j* may represent the multi-layer package assembly 800*i* subsequent to coupling another reinforced portion (e.g., reinforced portion D2 of FIG. 5) with the top metal layer, forming a metal layer (e.g., metal layer M1 of FIG. 5) on the other reinforced portion and forming a solder resist layer (e.g., one or more solder resist layers 242 of FIG. 5) on the metal layer, as can be seen.

The multi-layer package assembly 800*k* may represent the multi-layer package assembly 800*j* subsequent to detaching the multi-layer package assembly from the temporary film and carrier. The detachment may be performed, for example, by thermal release or by chemical etching.

The multi-layer package assembly 800*l* may represent the multi-layer package assembly 800*k* subsequent to coupling a die with the multi-layer package assembly. The die may be coupled using any suitable techniques including, for example, using die-level interconnects such as bumps, pillars to electrically couple the die with the multi-layer package assembly 800*l*.

Techniques and configurations described in connection with FIGS. 5-8 may allow integration of thick prepreg layers in later stages of package fabrication without warping the substrate through high temperature processing such as, for example, hot pressing. The prepreg material may be coated on at least one side with a soft polymer-based material to enable low temperature processing when integrated in the stackup. Embodiments disclosed herein may allow the building of an asymmetric package assembly with multiple adjacent or non-adjacent core layers, which may reduce a number of layers needed and hence reduce a cost of fabrication. The use of a polymer coating (e.g., soft dielectric layers 726, 728) may reduce conductor losses for metal conductors disposed on the polymer coating. The lower warpage may facilitate assembly of other components by surface mount technology (SMT) on the same package as the die for mm-wave active antenna modules.

Various operations are described as multiple discrete operations in turn, in a manner that is most helpful in understanding the claimed subject matter. However, the order of description should not be construed as to imply that these operations are necessarily order dependent.

Figure 9:
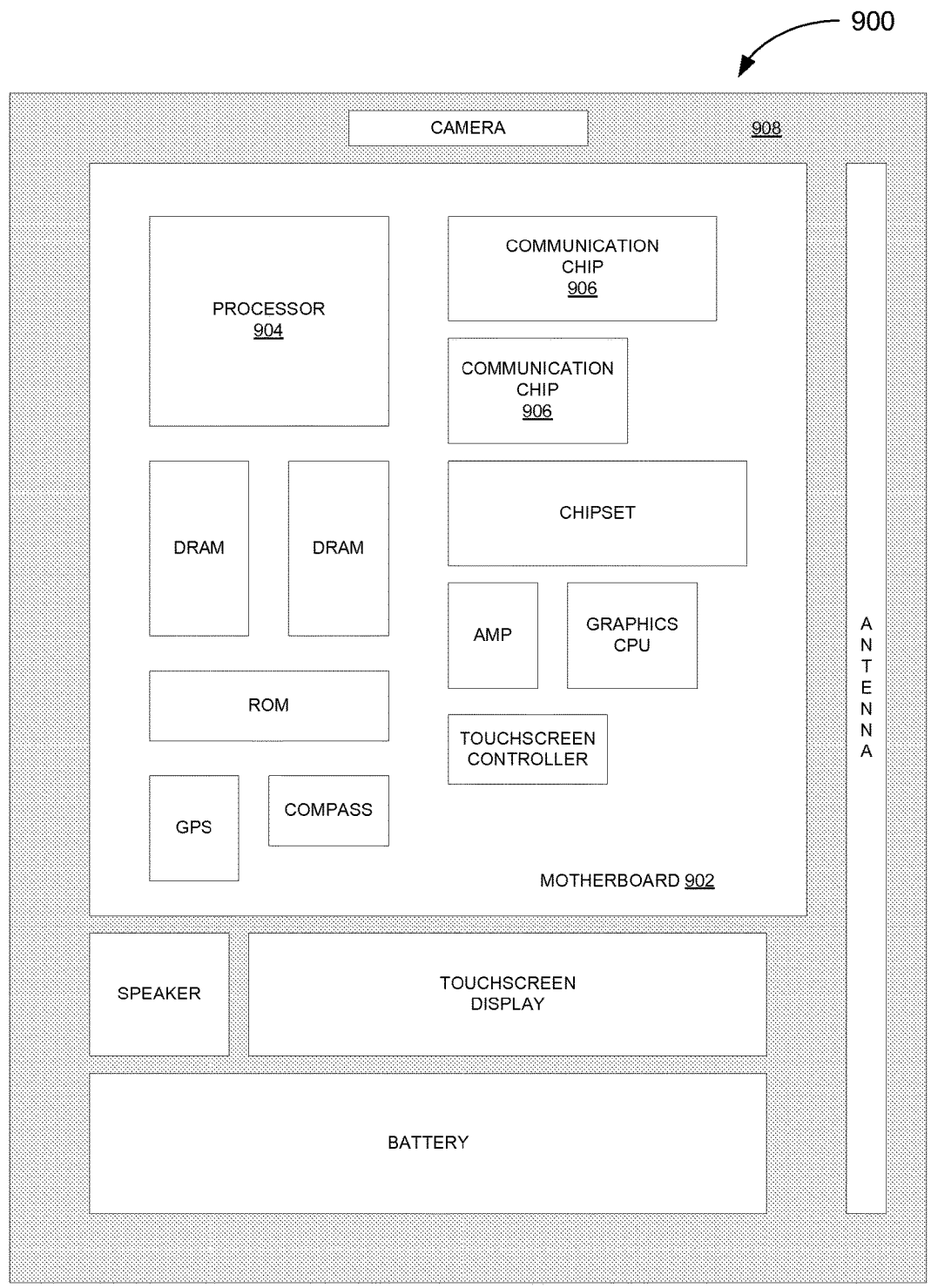
FIG. 9 schematically illustrates a computing device that includes a multi-layer package assembly as described herein, in accordance with some embodiments.

Embodiments of the present disclosure may be implemented into a system using any suitable hardware and/or software to configure as desired. FIG. 9 schematically illustrates a computing device that includes multi-layer package assembly (e.g., multi-layer package assembly 200, 300, 500 or 600 of FIG. 2, 3, 5 or 6) as described herein, in accordance with some embodiments. The computing device 900 may house a board such as motherboard 902 (e.g., in housing 908). The motherboard 902 may include a number of components, including but not limited to a processor 904 and at least one communication chip 906. The processor 904 may be physically and electrically coupled to the motherboard 902. In some implementations, the at least one communication chip 906 may also be physically and electrically coupled to the motherboard 902. In further implementations, the communication chip 906 may be part of the processor 904.

Depending on its applications, computing device 900 may include other components that may or may not be physically and electrically coupled to the motherboard 902. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3 G, 4 G, 5 G, and beyond. The communication chip 906 may operate in accordance with other wireless protocols in other embodiments.

The computing device 900 may include a plurality of communication chips 906. For instance, a first communication chip 906 may be dedicated to shorter range wireless communications such as WiGig, Wi-Fi and Bluetooth and a second communication chip 906 may be dedicated to longer range wireless communications such as GPS, EDGE, GPRS, CDMA, WiMAX, LTE, EV-DO, and others.

The processor 904 of the computing device 900 may be packaged in an IC assembly (e.g., IC assembly 100 of FIG. 1) or multi-layer package assembly (e.g., multi-layer package assembly 200, 300, 500 or 600 of FIG. 2, 3, 5 or 6) as described herein. For example, the circuit board 122 of FIG. 1 may be a motherboard 902 and the processor 904 may be a die 102 mounted on a package substrate 121 of FIG. 1. The package substrate 121 and the motherboard 902 may be coupled together using package-level interconnects such as solder balls 112. Other suitable configurations may be implemented in accordance with embodiments described herein. The term "processor" may refer to any device or portion of a device that processes electronic data from registers and/or memory to transform that electronic data into other electronic data that may be stored in registers and/or memory.

The communication chip 906 may also include a die (e.g., RF die) that may be packaged in an IC assembly (e.g., IC assembly 100 of FIG. 1) or multi-layer package assembly (e.g., multi-layer package assembly 200, 300, 500 or 600 of FIG. 2, 3, 5 or 6) as described herein. In further implementations, another component (e.g., memory device or other integrated circuit device) housed within the computing device 900 may include a die that may be packaged in an IC assembly (e.g., IC assembly 100 of FIG. 1) or multi-layer package assembly (e.g., multi-layer package assembly 200, 300, 500 or 600 of FIG. 2, 3, 5 or 6) as described herein.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 900 may be a mobile computing device in some embodiments. In further implementations, the computing device 900 may be any other electronic device that processes data.

Examples

According to various embodiments, the present disclosure describes an integrated circuit (IC) package assembly. Example 1 of an IC package assembly may include a first layer having a first side and a second side disposed opposite to the first side, a second layer coupled with the first side of the first layer, one or more antenna elements coupled with the second layer, and a third layer coupled with the second side of the first layer, wherein the first layer is a reinforcement layer having a tensile modulus that is greater than a tensile modulus of the second layer and the third layer. Example 2 may include the IC package assembly of Example 1, wherein the second layer and the third layer have a same material composition and a surface roughness of the second layer and the third layer is less than a surface roughness of the first layer. Example 3 may include the IC package assembly of Example 1, wherein the first layer comprises liquid crystal polymer (LCP) or prepreg material and the second layer and the third layer comprise liquid crystal polymer (LCP) or an epoxy-based material. Example 4 may include the IC package assembly of Example 3, wherein the first layer comprises LCP with glass and the second layer and the third layer comprise LCP without glass. Example 5 may include the IC package assembly of Example 1, wherein the one or more antenna elements comprise one or more plated metal features formed on the second layer. Example 6 may include the IC package assembly of Example 1, wherein a first side of the third layer is coupled with the second side of the first layer, the IC package assembly further comprising an electrical routing feature disposed on a second side of the third layer, the second side of the third layer being disposed opposite to the first side of the third layer and a via structure or plated-through hole structure coupled with the electrical routing feature and the one or more antenna elements, the via structure or plated-through hole structure extending through the first layer, the second layer and the third layer. Example 7 may include the IC package assembly of any of Examples 1-6, wherein the first layer defines a plane extending in a horizontal direction and no plated metal features for routing electrical signals in the horizontal direction are directly disposed on the first layer. Example 8 may include the IC package assembly of any of Examples 1-6, wherein the one or more antenna elements include a first capacitive element, the IC package assembly further comprising a second capacitive element directly coupled with the third layer, wherein the first capacitive element and the second capacitive element are components of a multi-layer capacitively coupled antenna. Example 9 may include the IC package assembly of any of Examples 1-6, further comprising a fourth layer having a first side and a second side disposed opposite to the first side, a fifth layer coupled with the first side of the fourth layer, and a sixth layer coupled with the second side of the fourth layer, wherein the fourth layer is a reinforcement layer having a tensile modulus that is greater than a tensile modulus of the fifth layer and the sixth layer, wherein the fifth layer is coupled with the third layer. Example 10 may include the IC package assembly of any of Examples 1-6, further comprising an antenna ground layer coupled with the third layer and a radio frequency (RF) die coupled with the antenna ground layer.

According to various embodiments, the present disclosure describes a method of fabricating a multi-layer package assembly. Example 11 may of the method may include providing a first layer having a first side and a second side disposed opposite to the first side, coupling a second layer with the first side of the first layer, coupling a third layer with the second side of the first layer and forming one or more antenna elements on the second layer, wherein the first layer is a reinforcement layer having a tensile modulus that is greater than a tensile modulus of the second layer and the third layer. Example 12 may include the method of Example 11, wherein coupling the second layer with the first side of the first layer and coupling the third layer with the second side of the first layer is performed by lamination. Example 13 may include the method of any of Examples 11-12, wherein forming the one or more antenna elements comprises plating the second layer with a metal. Example 14 may include the method of Example 13, further comprising forming an opening for a via or plated-through hole (PTH) through the first layer, the second layer and the third layer. Example 15 may include the method of Example 14, further comprising depositing a metal to fill the opening during a same metal deposition process that is used to form the one or more antenna elements. Example 16 may include the method of Example 14, further comprising forming a solder mask layer on the second layer.

According to various embodiments, the present disclosure describes a computing device. Example 17 of the computing device may include a circuit board and an integrated circuit (IC) package assembly coupled with the circuit board, the IC package assembly including a first layer having a first side and a second side disposed opposite to the first side, a second layer coupled with the first side of the first layer, one or more antenna elements coupled with the second layer, and a third layer coupled with the second side of the first layer, wherein the first layer is a reinforcement layer having a tensile modulus that is greater than a tensile modulus of the second layer and the third layer. Example 18 may include the computing device of Example 17, wherein a first side of the third layer is coupled with the second side of the first layer, the IC package assembly further comprising an electrical routing feature disposed on a second side of the third layer, the second side of the third layer being disposed opposite to the first side of the third layer and a via structure or plated-through hole structure coupled with the electrical routing feature and the one or more antenna elements, the via structure or plated-through hole structure extending through the first layer, the second layer and the third layer. Example 19 may include the computing device of any of Examples 17-18, wherein the first layer defines a plane extending in a horizontal direction and no plated metal features for routing electrical signals in the horizontal direction are directly disposed on the first layer. Example 20 may include the computing device of any of Examples 17-18, wherein the computing device is a mobile computing device including one or more of a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) package assembly comprising:
    a first layer having a first side and a second side disposed opposite to the first side;
    a second layer coupled with the first side of the first layer;
    one or more antenna elements coupled with the second layer;
    a third layer coupled with the second side of the first layer, wherein the first layer is a reinforcement layer having a tensile modulus that is greater than a tensile modulus of the second layer and the third layer;
    wherein the first layer defines a plane extending in a horizontal direction; and
    wherein no plated metal features for routing electrical signals in the horizontal direction are directly disposed on the first layer.

2. The IC package assembly of claim 1, wherein:
    the second layer and the third layer have a same material composition; and a surface roughness of the second layer and the third layer is less than a surface roughness of the first layer.

3. The IC package assembly of claim 1, wherein:
    the first layer comprises liquid crystal polymer (LCP) or prepreg material; and
    the second layer and the third layer comprise LCP or an epoxy-based material.

4. The IC package assembly of claim 3, wherein:
    the first layer comprises LCP with glass; and
    the second layer and the third layer comprise LCP without glass.

5. The IC package assembly of claim 1, wherein:
    the one or more antenna elements comprise one or more plated metal features formed on the second layer.

6. The IC package assembly of claim 1, wherein a first side of the third layer is coupled with the second side of the first layer, the IC package assembly further comprising:
    an electrical routing feature disposed on a second side of the third layer, the second side of the third layer being disposed opposite to the first side of the third layer; and
    a via structure or plated-through hole structure coupled with the electrical routing feature and the one or more antenna elements, the via structure or plated-through hole structure extending through the first layer, the second layer and the third layer.

7. The IC package assembly of claim 1, wherein the one or more antenna elements include a first capacitive element, the IC package assembly further comprising:
    a second capacitive element directly coupled with the third layer, wherein the first capacitive element and the second capacitive element are components of a multi-layer capacitively coupled antenna.

8. The IC package assembly of claim 1, further comprising:
    a fourth layer having a first side and a second side disposed opposite to the first side;
    a fifth layer coupled with the first side of the fourth layer; and
    a sixth layer coupled with the second side of the fourth layer, wherein the fourth layer is a reinforcement layer having a tensile modulus that is greater than a tensile modulus of the fifth layer and the sixth layer, wherein the fifth layer is coupled with the third layer.

9. The IC package assembly of claim 1, further comprising:
    an antenna ground layer coupled with the third layer; and
    a radio frequency (RF) die coupled with the antenna ground layer.

10. A method of fabricating a multi-layer package assembly, the method comprising:
    providing a first layer having a first side and a second side disposed opposite to the first side;
    coupling a second layer with the first side of the first layer;
    coupling a third layer with the second side of the first layer;
    forming one or more antenna elements on the second layer, wherein the first layer is a reinforcement layer having a tensile modulus that is greater than a tensile modulus of the second layer and the third layer;
    wherein coupling the second layer with the first side of the first layer or coupling the third layer with the second side of the first layer is performed by lamination;
    wherein forming the one or more antenna elements comprises plating the second layer with a metal; and
    forming an opening for a via or plated-through hole (PTH) through the first layer, the second layer and the third layer.

11. The method of claim 10, further comprising:
    depositing a metal to fill the opening during a same metal deposition process that is used to form the one or more antenna elements.

12. The method of claim 10, further comprising:
    forming a solder mask layer on the second layer.

13. A computing device comprising:
    a circuit board; and
    an integrated circuit (IC) package assembly coupled with the circuit board, the IC package assembly including:
        a first layer having a first side and a second side disposed opposite to the first side;
        a second layer coupled with the first side of the first layer;
        one or more antenna elements coupled with the second layer;
        a third layer coupled with the second side of the first layer, wherein the first layer is a reinforcement layer having a tensile modulus that is greater than a tensile modulus of the second layer and the third layer;
        an antenna ground layer coupled with the third layer; and a radio frequency (RF) die coupled with the antenna ground layer.

14. The computing device of claim 13, wherein a first side of the third layer is coupled with the second side of the first layer, the IC package assembly further comprising:
an electrical routing feature disposed on a second side of the third layer, the second side of the third layer being disposed opposite to the first side of the third layer; and
a via structure or plated-through hole structure coupled with the electrical routing feature and the one or more antenna elements, the via structure or plated-through hole structure extending through the first layer, the second layer and the third layer.

15. The computing device of claim 13, wherein:
the computing device is a mobile computing device including one or more of a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *